United States Patent
Wang et al.

(10) Patent No.: US 9,936,570 B2
(45) Date of Patent: Apr. 3, 2018

(54) INTERCONNECT TOPOLOGY WITH STAGGERED VIAS FOR INTERCONNECTING DIFFERENTIAL SIGNAL TRACES ON DIFFERENT LAYERS OF A SUBSTRATE

(71) Applicant: Intel Corporation, Santa Clara, CA (US)

(72) Inventors: Min Wang, Santa Clara, CA (US); Russell N. Shryock, Sacramento, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/570,791

(22) Filed: Dec. 15, 2014

(65) Prior Publication Data
US 2016/0172734 A1    Jun. 16, 2016

(51) Int. Cl.
| | | |
|---|---|---|
| H05K 1/02 | (2006.01) | |
| H01P 3/02 | (2006.01) | |
| H05K 1/11 | (2006.01) | |

(52) U.S. Cl.
CPC ......... *H05K 1/0245* (2013.01); *H05K 1/0251* (2013.01); *H01P 3/026* (2013.01); *H05K 1/116* (2013.01); *H05K 2201/09636* (2013.01)

(58) Field of Classification Search
CPC .. H05K 1/0245; H05K 1/0248; H05K 1/0251; H01P 3/04
USPC .......................................................... 333/4, 5
See application file for complete search history.

(56) References Cited

U.S. PATENT DOCUMENTS

| | | | | |
|---|---|---|---|---|
| 5,039,824 A | * | 8/1991 | Takashima et al. . | H05K 1/0228 174/262 |
| 7,897,880 B1 | * | 3/2011 | Goergen et al. ..... | H05K 1/0237 174/261 |
| 2006/0284697 A1 | * | 12/2006 | Lin et al. ................ | H01P 3/081 333/4 |
| 2007/0130555 A1 | * | 6/2007 | Osaka ............... | H01L 23/49838 439/14 |
| 2010/0214039 A1 | * | 8/2010 | Lin et al. ............ | H01P 1/20345 333/204 |
| 2012/0161893 A1 | * | 6/2012 | Ye ........................... | H01P 3/026 333/5 |
| 2012/0229998 A1 | * | 9/2012 | Kagaya ..................... | H01P 1/02 361/777 |
| 2012/0243184 A1 | * | 9/2012 | Lee ...................... | H05K 1/0245 361/737 |

(Continued)

*Primary Examiner* — Benny Lee
(74) *Attorney, Agent, or Firm* — Womble Bond Dickinson (US) LLP

(57) ABSTRACT

An interconnect topology is disclosed that includes a plurality of interconnections, each of which is coupled together using a via, where at least two of the vias are staggered with respect to each other. In one embodiment, the interconnect topology comprises a substrate, multiple signal traces routed through the substrate on multiple layers, and a plurality of vias, where each via couples a pair of the signal traces to form an interconnection between different ones of the multiple layers, and where a pair of vias comprise a first via to carry a positive differential signal via and a second via to carry a negative differential signal that are coupled to signal traces to form a differential signal pair. The differential first and second vias are staggered with respect to each other.

15 Claims, 3 Drawing Sheets

(56) References Cited

U.S. PATENT DOCUMENTS

2013/0090014 A1\* 4/2013 Champion ........... H05K 1/0245
439/626
2013/0175077 A1\* 7/2013 Kim et al. ........... H05K 1/0222
174/262

\* cited by examiner

Routing a plurality of signal traces routed through a substrate on a plurality of layers
601

Coupling two pairs of signal traces using a pair of vias to form a pair of interconnections between different layers of the plurality of layers, wherein the pair of the plurality of vias comprise a differential positive via and a differential negative via coupling signal traces of the plurality of traces to form a differential signal pair, the differential positive and negative vias being staggered with respect to each other
602

INTERCONNECT TOPOLOGY WITH STAGGERED VIAS FOR INTERCONNECTING DIFFERENTIAL SIGNAL TRACES ON DIFFERENT LAYERS OF A SUBSTRATE

FIELD OF THE INVENTION

Embodiments of the present invention relate to the field of interconnect topologies that include differential signal pairs in a substrate; more particularly, embodiments of the present invention relate to staggering a pair of vias that are part of interconnections forming a pair of differential signals in a substrate.

BACKGROUND OF THE INVENTION

A printed circuit board (PCB) includes a number of signal traces on a number of different layers that can be interconnected to form an interconnect topology. The interconnection of signal traces between the layers is often made using metal deposited through vias in the PCB that connects the two signal traces together. The portion of a via that extends through the PCB beyond the portion that interconnects the layers to form a signal path is referred to as a via stub.

A long via stub on PCB platforms is usually capacitive in nature and causes large return loss and undesirable resonance behavior. A long via stub has been known to cause problems for high-speed serial input/output (IO) platform signaling, especially for server 10+ layer backplane topologies, and for beyond 10 Gbps data rate (e.g., 10GBASE KR, 11G Quick Path Interconnect (QPI), 16G PCI-Express Gen 4 (PCIe4), 25-40G Serializer/Deserializer (SerDes). While compensation for PCB conductor and dielectric loss can be made with equalization circuits and PCB crosstalk can be addressed with stripline interconnections, reflections due to via stubs are hard to compensate for or cancel out, even using a limited tap decision feedback equalizer (DFE). This phenomenon becomes more prominent if lower loss PCB materials are used and the data rate goes higher, in which case long via stubs can completely impair a link without proper mitigation.

The worst case via stub occurs when signal transits from a layer 1 microstrip to a layer 3 stripline, i.e., when a via is used to connect a trace on layer 1 to a trace on layer 3. The worst case stub length can be as long as 90 to 120 mils (or even longer), depending on the board thickness. Due to layout space constraints and discrete components (e.g., alternating current (AC) coupling capacitor, electromagnetic interference (EMI) filter, on-board electro static discharge (ESD), a worst case via stub is almost unavoidable when routing multiple layer PCBs.

Long stubs associated with the press-fit connectors are even more problematic. For a high-speed serial interface like PCI-Express Gen 2 (PCIe2), the number of via stubs could be 10 or more, when considering that there are two via stubs for AC coupling capacitors, two via stubs for logic analyzers, two via stubs for each connector, and one via stub for each silicon package. Therefore, via stubs are one of the key challenges when designing platform interconnect solutions for PCIe2.

Some of the most effective mitigations on the via stub effect are via back drilling (to remove via stubs that are not in the interconnection path) or micro-vias (where unnecessary stubs are not in the design in the first place, requiring High Density Interconnects (HDI) board technology. However, they are generally too costly to implement from a manufacturing perspective even for server platforms. An alternative approach to the problems associated with via stub effects is through inductive compensation with special routing of the PCB traces close to the via stub, to increase the inductance and cancel out via the stub capacitance. This approach has frequency limitations and implications on PCB real estate. A third approach is to add more DFE taps or introduce new DFE architectures (e.g., floating tap DFE) that are more effective in mitigating reflections. This involves higher design complexity and risk and usually requires higher input/output (IO) power consumption and larger die size.

Traditionally, the differential positive and differential negative vias are routed in a perfectly symmetric fashion to optimize for differential signal transmission. In other words, the vias used to connect signal traces of different layers in a PCB are aligned with each other and any ground stitching vias.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 6 is one embodiment of a process for forming an interconnect topology.

DETAILED DESCRIPTION OF THE PRESENT INVENTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In one embodiment, the positive via and the negative via within a differential pair are routed in a staggered or skewed fashion in a substrate (e.g., printed circuit board (PCB). This is done in order to spread out the discontinuity or reflections from the positive interconnect and negative interconnect, thereby reducing the overall impedance discontinuity and improve the interconnect performance and/or bandwidth.

Figure 1B:
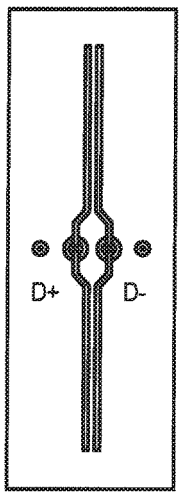
FIG. 1B illustrates a prior art via arrangement.
Figure 1A:
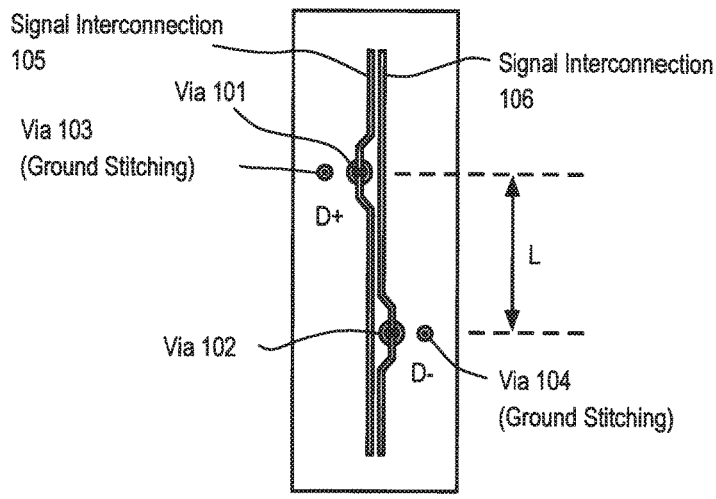
FIG. 1A illustrates one embodiment of a staggered via arrangement.

FIG. 1A illustrates one embodiment of a pair of vias in a staggered or skewed arrangement. The pair of vias are the positive and negative vias of two interconnections that form a pair of differential signals. That is, the positive via is a via that carries a positive differential signal and the negative via is a via that carries a negative differential signal.

Referring to FIG. 1A, positive via $D^+$ 101, which is part of signal interconnection 105, is shown next to ground stretching via 103. Metal in positive via $D^+$101 connects traces on two different layers of a substrate (e.g., a PCB) to form signal interconnection 105. Negative via D⁻ 102, which is part of signal interconnection 106, is shown next to ground stretching via 104. Metal in negative D⁻ 102 connects traces on two different layers of the substrate to form signal interconnection 106.

In one embodiment, signal interconnections 105 and 106 are two differential signals. In one embodiment, the two different layers of signal interconnection 106 are the same two layers of the substrate that form signal interconnection 105. In alternative embodiments, this is not the case.

As shown in FIG. 1A, positive D⁺ 101 is separated from negative via D⁻ 102 by a skew distance L. This skew distance L representing the staggered or skewed relationship is different than the prior art, which is shown in FIG. 1B, where the positive via D⁺ is located next to the negative via D⁻ for a differential pair of signals (i.e., the skew distance L is zero).

The staggered via approach introduces a skew between D+ and D− vias (or staggered D+ and D− via arrangement) on board routing to reduce the total discontinuity. While crosstalk noise are common mode and rejected by differential signaling, via stub induced noises on the D+ and D− vias are superposed instead of rejected. With the staggered via technique disclosed herein with a certain skew between D+ and D− at the via transition location, the discontinuity is decentralized and part of the reflections compensate for each other. With the disclosed via skew, a smaller capacitive dip is expected in the TDR profile. The staggered via arrangement provides benefits with respect to the platform bill of materials (BOM) cost, silicon die cost, input/output (I/O) power, and overall electrical performance.

Figure 2:
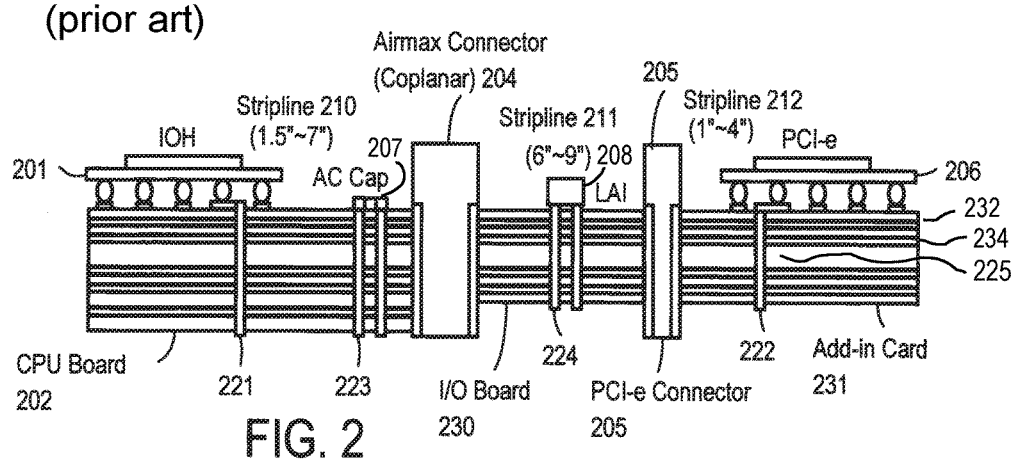
FIG. 2 illustrates one embodiment of a bus topology.

The staggered via arrangement may be used in a number of interconnect topologies. FIG. 2 illustrates one embodiment of a bus topology that utilizes the staggered via techniques described herein. In one embodiment, the bus topology is the PCI express Gen 2 (PCIe2 topology). Referring to FIG. 2, a CPU integrated circuit (IC) 201 is attached to a CPU board 202. In one embodiment, CPU IC 201 includes an input/output hub (IOH). CPU board 202 is connected to a connector 204. In one embodiment, connector 204 is an AIRMAX (coplanar) connector (though other connectors may be used). The other side of connector 204 is coupled to an IO board 230. IO board 230 is also connected to a Peripheral Component Interconnect Express (PCIe) connector 205. PCIe connector 205 is coupled to an add-in card 231, which includes an IC 206. In one embodiment, IC 206 includes a PCI-e IC. An AC coupling capacitor—(AC Cap)—207 is attached to CPU board 202. A logical analyzer interposer (LAI) 208 is coupled to IO board 230.

In one embodiment, strip line 210 runs between connector 204 and the first connection of CPU 201 to CPU board 202 closest to connector 204. In one embodiment, strip line 210 is approximately 1.5 to 7 inches. Similarly, strip line 211 runs between connector 204 and connector 205. In one embodiment, strip line 211 is 6 to 9 inches in length. Also, strip line 212 runs between connector 205 and the first connection of IC 206 to the add-in card board 231. In one embodiment, strip line 212 is 1 to 4 inches in length.

Staggered via pairs 221, 222, 223 and 224 each represent a staggered via pair which includes pairs of differential signals that are routed over traces of different layers of the respective boards, where the vias connect the traces on the different layers. For example, in FIG. 2, each of the signal interconnections is routed on layers 1 (232) and 3 (234) of the respective boards using a via to interconnect the traces.

Note that this results in a via stub 225 that extends beyond layer 3 through the remaining layers of the board.

Note that other bus topologies may include the staggered via interconnections.

Figure 3A:
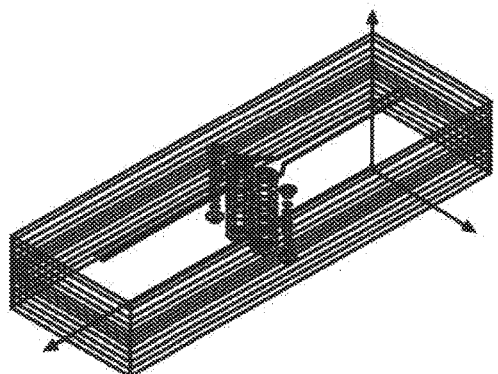
FIG. 3A illustrates a conventional via transition design.
Figure 3B:
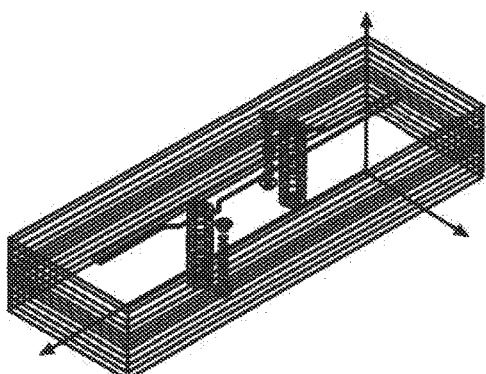
FIG. 3B illustrates one embodiment of the staggering via arrangement (in a 3D view).

The PCB routing structure for a non-skewed via arrangement and a via skewed arrangement described herein are shown in FIGS. 3A and 3B in both 3D view. Referring to FIGS. 3A and 3B, the vias next to signal vias are ground stitching vias. In one embodiment, depending on the via stub length, adjacent via transition distance, and data transfer rate, the skew distance varies. In one embodiment, the skew distance L (FIG. 1A) is greater than 100 mil. In another embodiment, the skew distance is between 200 mil-400 mil (e.g., 300 mil). In one embodiment, the data transfer rate is at least 5 Gbps (e.g., 10 Gbps, 16 Gbps, etc.), though the techniques described herein may be used in interconnects operating at slower speeds (e.g., 3 Gbps). In one embodiment, the skew distance varies based on via stub length. For example, in one embodiment, if the via stub length is 50 mil (or greater than 50 mil but less than 75 mil) then a skew distance of around 190 mil is used; if the via stub length is 75 mil (or greater than 75 mil but less than 100 mil), then a skew distance of 200 mil is used; if the via stub length is 100 mil (or greater than 200 mil), then a skew distance of 300 mil is used. Note that in one embodiment, the staggered via arrangement is used when there is a via stub length of greater than 50 mil.

Figure 4:
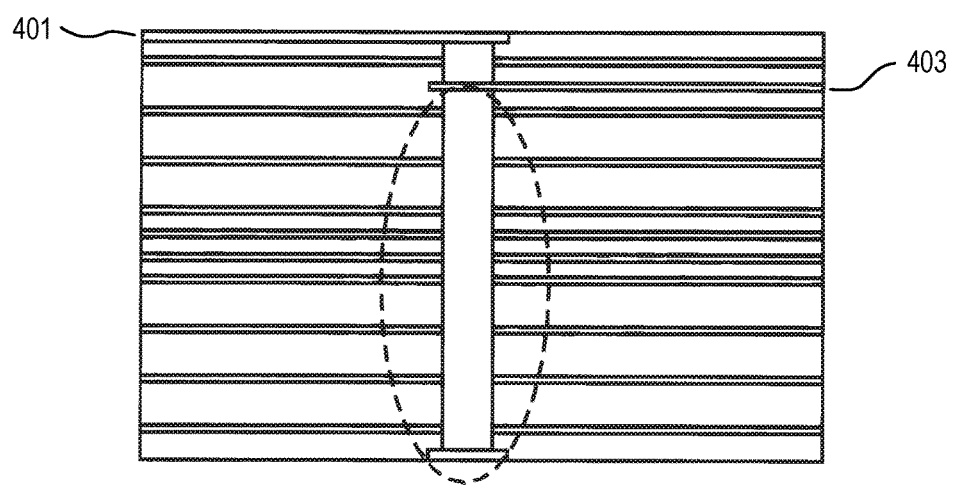
FIG. 4 illustrates a worst case via stub.

Four different 3D structures were modeled—no via skew, 100 mil, 200 mil, and 300 mil via skews. The stackup used is a 103 mil thick 18-layer server backplane board. The worst case via stub involving a layer 1 (401) to layer 3 (403) transition was modeled, which is shown in FIG. 4. The via dimension used is 10/12/20/30 mil (hole/pad/antipad size) and via pitch is 40 mil.

A TDR response comparison among the topologies having an interconnection with no via skew, 300 mil skew and 100 mil skew indicates that both the 300 mil skew and 100 mil skew cases have smaller impedance discontinuity than the no skew case and indicates that the 300 mil skew case is much better than the 100 mil skew case. The system level signal integrity margin impacts were also studied based on these 3D models. The timing and voltage margin comparison for studied data transfer rates that include 5 Gbps, 6.4 Gbps, and 8 Gbps, using both 8b10b encoded and binary stimulus patterns, showed that 300 mil is optimal skew distance (among the modeled skews) in almost all cases. It also showed significant eye margin improvement with the disclosed via skew technique—an average of over 20 ps eye width and 65 mV eye height improvement across different data rates, which significantly helps the channel system bandwidth. Note that only 2-4 via stubs were embedded in the channel in this study, while in reality more via stubs appear in PCI-Express like buses and therefore more margin improvements are expected.

Examining the frequency response of different models, a channel differential mode insertion loss comparison between all four cases, using a channel that is 10" long with 3 via stubs, showed that the skewed via channels (especially in the 300 mil and 200 mil cases) avoided the huge resonance peak at around 12 GHz, although bringing in slight more insertion loss between 6 GHz and 10 GHz.

Figure 5:
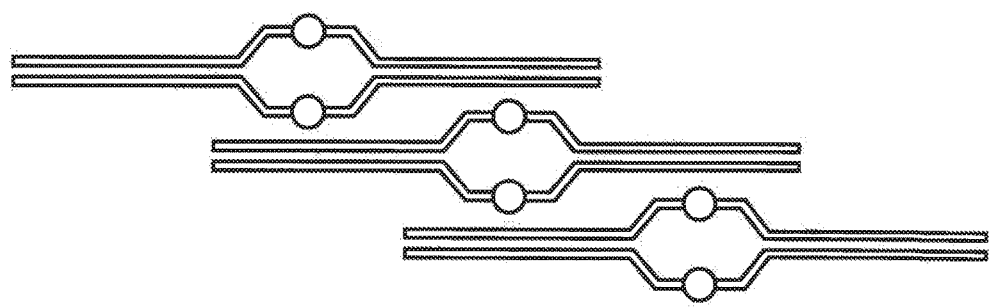
FIG. 5 illustrates crosstalk is relatively strong at via transition locations spacing constraints.

FIG. 5 illustrates crosstalk is relatively strong at via transition locations spacing constraints. Designers should make appropriate engineering tradeoff between AC common mode noise budget and differential mode eye margins. Usually the differential mode timing/voltage budgets are much tighter than common mode budget, where this technique can be implemented. The via pitch is usually much larger than differential trace inter-pair pitch. At transition locations, intra-pair spacing is quite large and inter-pair spacing is quite small, as shown in FIG. 5. Good differential signaling does not occur. Therefore, crosstalk is already larger at transition locations and via skew should not bring in much increase.

Advantages of embodiments of the invention versus other solutions include one or more of the following:
- Comparing to use of via back drilling: the staggered via approach is cost free, while via back drilling has a very high cost barrier to be adopted;
- Comparing to use of micro via: the staggered via approach is cost free, while micro via comes in with much higher PCB cost;
- Comparing to use of inductive compensation: the staggered via approach does not consume extra PCB routing space while inductive routing does. The staggered via approach seems to be more effective from time-domain margin data;
- Comparing to use of a more complicated equalizer: the staggered via approach does not consume more power and help reduce the IO die size, cost, time to market (TTM), and engineering risk;
- The staggered via approach applies universally to high speed IO (HSIO) buses, and the higher speed, the more effective, FIG. 6 is one embodiment of a process for forming an interconnect topology. Referring to FIG. 6, the process begins by routing a plurality of signal traces routed through a substrate on a plurality of layers (process block 601). This is performed in a manner well-known to those skilled in the art. Next, the process couples two pairs of signal traces using a pair of vias to form a pair of interconnections between different layers of the plurality of layers, wherein the pair of the plurality of vias comprise a first via to carry a positive differential signal via and a second via to carry a negative differential signal, the first and second vias coupling signal traces of the plurality of traces to form a differential signal pair, where the first and second vias are staggered with respect to each other (process block 602). In one embodiment, the first and second vias are staggered with respect to each other by an amount that is based on via stub length.

In a first example embodiment, an interconnect topology comprises: a substrate; a plurality of signal traces routed through the substrate on a plurality of layers; and a plurality of vias, each via coupling a pair of signal traces in the plurality of signal traces to form an interconnection between different layers of the plurality of layers, and wherein a pair of the plurality of vias comprise a first via to carry a positive differential signal and a second via to carry a negative differential signal that are coupled to signal traces of the plurality of traces to form a differential signal pair and where the first and second vias are staggered with respect to each other.

In another example embodiment, the subject matter of the first example embodiment can optionally include that the first and second vias are staggered with respect to each other by an amount that is based on via stub length.

In another example embodiment, the subject matter of the first example embodiment can optionally include that a via stub of each of the first and second vias is greater than 50 mil.

In another example embodiment, the subject matter of the first example embodiment can optionally include that the first and second vias are staggered at least 100 mil.

In another example embodiment, the subject matter of the first example embodiment can optionally include that the first and second vias are staggered between 200-400 mil.

In another example embodiment, the subject matter of the first example embodiment can optionally include that the first and second vias are staggered by approximately 300 mil.

In another example embodiment, the subject matter of the first example embodiment can optionally include that the vias of the pair are staggered with respect to each other by an amount that is based on data rate of signal transmission on the differential signal pair.

In another example embodiment, the subject matter of the first example embodiment can optionally include that the data rate is greater than 5 GHz.

In another example embodiment, the subject matter of the first example embodiment can optionally include that the substrate comprises a printed circuit board (PCB).

In a second example embodiment, an interconnect topology comprises: a printed circuit board (PCB); and a pair of interconnections that form a differential signal pair, a first of the pair of interconnections including a first plurality of signal traces routed through the PCB on a first plurality of layers coupled with a first via to carry a positive differential signal and a second of the pair of interconnections including a second plurality of signal traces routed through the PCB on a second plurality of layers coupled with a second via to carry a negative differential signal, where the first and second vias of two interconnections are staggered with respect to each other.

In another example embodiment, the subject matter of the second example embodiment can optionally include that the first and second vias are staggered with respect to each other by an amount that is based on via stub length.

In another example embodiment, the subject matter of the second example embodiment can optionally include that a via stub of each of the first and second vias is greater than 50 mil.

In another example embodiment, the subject matter of the second example embodiment can optionally include that the first and second vias are staggered at least 100 mil.

In another example embodiment, the subject matter of the second example embodiment can optionally include that the first and second vias are staggered between 200-400 mil.

In another example embodiment, the subject matter of the second example embodiment can optionally include that the first and second vias are staggered by approximately 300 mil.

In another example embodiment, the subject matter of the second example embodiment can optionally include that the vias of the pair are staggered with respect to each other by an amount that is based on data rate of signal transmission on the differential signal pair.

In another example embodiment, the subject matter of the second example embodiment can optionally include that the data rate is greater than 5 GHz.

In another example embodiment, the subject matter of the second example embodiment can optionally include a first ground stitching via located adjacent to the first via and a second ground stitching via located adjacent to the second via.

In a third example embodiment, a process for forming an interconnect topology comprises: routing a plurality of signal traces routed through a substrate on a plurality of layers; and coupling two pairs of signal traces using a pair of vias to form a pair of interconnections between different layers of the plurality of layers, wherein the pair of the plurality of vias comprise a first via to carry a positive differential signal and a second via to carry a negative differential signal, the first and second via coupling signal traces of the plurality of traces to form a differential signal pair, where the first and second vias being staggered with respect to each other.

In another example embodiment, the subject matter of the second example embodiment can optionally include that the differential positive and negative vias are staggered with respect to each other by an amount that is based on via stub length.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An interconnect topology comprising:
   a substrate formed by a plurality of layers;
   a plurality of signal traces routed on the plurality of layers, the plurality of layers comprising a first layer and a second layer; and
   a plurality of vias comprising a first via and a second via, the first via and the second via forming a differential signal pair, the first via having a first via interconnect portion coupling a first pair of the signal traces in the plurality of signal traces to form a first interconnection between the first layer and the second layer and a first via stub portion that extends beyond the second layer through remaining layers of the plurality of layers of the substrate, wherein the first via is to carry a positive differential signal, the second via having a second via interconnect portion coupling a second pair of the signal traces to form a second interconnection between the first layer and the second layer and a second via stub portion that extends beyond the second layer through the remaining layers of the plurality of layers of the substrate, wherein the second via is to carry a negative differential signal, the first via stub portion and the second via stub portion being staggered with respect to each other by a skew distance to reduce noise induced by the first and second stub portions, and wherein the length of the first via stub portion is greater than 50 mil.

2. The interconnect topology defined in claim 1 wherein the skew distance depends on a data rate of signal transmission on the differential signal pair.

3. The interconnect topology defined in claim 2 wherein the data rate is greater than 5 GHz.

4. The interconnect topology defined in claim 1 wherein the skew distance is at least 100 mil.

5. The interconnect topology defined in claim 1 wherein the skew distance is between 200 mil and 400 mil.

6. The interconnect topology defined in claim 5 wherein the skew distance is approximately 300 mil.

7. The interconnect topology defined in claim 1 wherein the substrate comprises a printed circuit board (PCB).

8. An interconnect topology comprising:
   a printed circuit board (PCB); and
   a pair of interconnections that form a differential signal pair, a first of the pair of interconnections including a first plurality of signal traces routed on a first plurality of layers of the PCB that are coupled with a first via to carry a positive differential signal and a second of the pair of interconnections including a second plurality of signal traces routed on a second plurality of layers of the PCB that are coupled with a second via to carry a negative differential signal, the first via having a first via interconnect portion between a first layer and a second layer of the first plurality of layers and a first via stub portion extending beyond the second layer, the second via having a second via interconnect portion between the first layer and the second layer and a second via stub portion extending beyond the second layer, the first via stub portion and the second via stub portion being staggered with respect to each other by a skew distance to reduce noise induced by the first and second stub portions, wherein the length of the first via stub portion is greater than 50 mil.

9. The interconnect topology defined in claim 8 further comprising a first ground stitching via located adjacent to the first via and a second ground stitching via located adjacent to the second via.

10. The interconnect topology defined in claim 8 wherein the skew distance depends on a data rate of signal transmission on the differential signal pair.

11. The interconnect topology defined in claim 10 wherein the data rate is greater than 5 GHz.

12. The interconnect topology defined in claim 8 wherein the skew distance is approximately 300 mil.

13. The interconnect topology defined in claim 8 wherein the skew distance is at least 100 mil.

14. The interconnect topology defined in claim 8 wherein the skew distance is between 200 mil and 400 mil.

15. A process for forming an interconnect topology comprising:
   routing a plurality of signal traces on a plurality of layers, the plurality of layers comprising a first layer and a second layer; and
   coupling two pairs of signal traces using a pair of vias to form a pair of interconnections between the first layer and the second layer, the pair of vias comprising a first via and a second via to form a differential signal pair, the first via having a first via interconnect portion coupling a first pair of the signal traces to form a first interconnection between the first layer and the second layer and a first via stub portion that extends beyond the second layer through remaining layers of the plurality of layers of the substrate, wherein the first via is to carry a positive differential signal, the second via comprising a second via interconnect coupling a second pair of the signal traces to form a second interconnection between the first layer and the second layer, and a second via stub portion that extends beyond the second layer through the remaining layers of the plurality of layers of the substrate, wherein the second via is to carry a negative differential signal, the first via stub portion and the second via stub portion being staggered with respect to each other by a skew distance to reduce noise induced by the first and second stub portions, and wherein the length of the first via stub portion is greater than 50 mil.

* * * * *